(12) United States Patent
Frosien et al.

(10) Patent No.: US 6,667,478 B2
(45) Date of Patent: Dec. 23, 2003

(54) PARTICLE BEAM APPARATUS

(75) Inventors: Jürgen Frosien, Riemerling (DE); Stefan Lanio, Erding (DE)

(73) Assignee: Advantest Corp., Tokyo (JP)

(*) Notice: Subject to any disclaimer, the term of this patent is extended or adjusted under 35 U.S.C. 154(b) by 0 days.

(21) Appl. No.: 10/231,686

(22) Filed: Aug. 30, 2002

(65) Prior Publication Data
US 2003/0062478 A1 Apr. 3, 2003

(30) Foreign Application Priority Data
Sep. 4, 2001 (EP) .................................. 01121183

(51) Int. Cl.[7] .......................... G01N 23/00; B21K 7/00
(52) U.S. Cl. .......................... 250/310; 250/397
(58) Field of Search .................................. 250/310, 397

(56) References Cited

U.S. PATENT DOCUMENTS

| | | | | |
|---|---|---|---|---|
| 4,308,457 A | * | 12/1981 | Reimer | 250/397 |
| 4,641,034 A | * | 2/1987 | Okamura et al. | 250/492.2 |
| 5,422,486 A | * | 6/1995 | Herrmann et al. | 250/396 R |
| 5,644,132 A | * | 7/1997 | Litman et al. | 250/310 |
| 6,570,163 B1 | * | 5/2003 | El Gomati et al. | 250/397 |
| 2001/0048075 A1 | * | 12/2001 | Frosien | 250/307 |

FOREIGN PATENT DOCUMENTS

| | | | |
|---|---|---|---|
| EP | B-0 333 018 | * | 6/1994 |
| EP | A-1 022 766 | * | 7/2000 |

* cited by examiner

Primary Examiner—John R. Lee
Assistant Examiner—Erin-Michael Gill
(74) Attorney, Agent, or Firm—Muramatsu & Associates

(57) ABSTRACT

A particle beam apparatus with a source for generating a primary particle beam, means for focussing the primary particle beam onto a specimen, a detection system for detecting particles released at the specimen, first means to accelerate the primary particle beam to a first energy, first means to decelerate the primary particle beam before the detection system from the first energy to a second lower energy, second means to accelerate the primary particle beam after the detection system from the second energy to a third higher energy and second means to decelerate the primary particle beam from the third energy to a final beam energy. The detection system further comprises a converter to convert particles released at the specimen into converted secondary particles which will be detected by the detector.

24 Claims, 10 Drawing Sheets

Fig. 4A
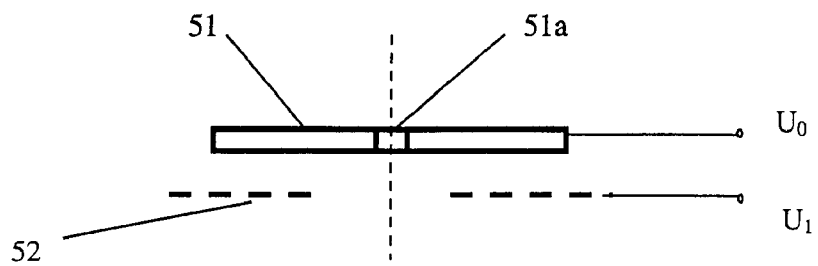
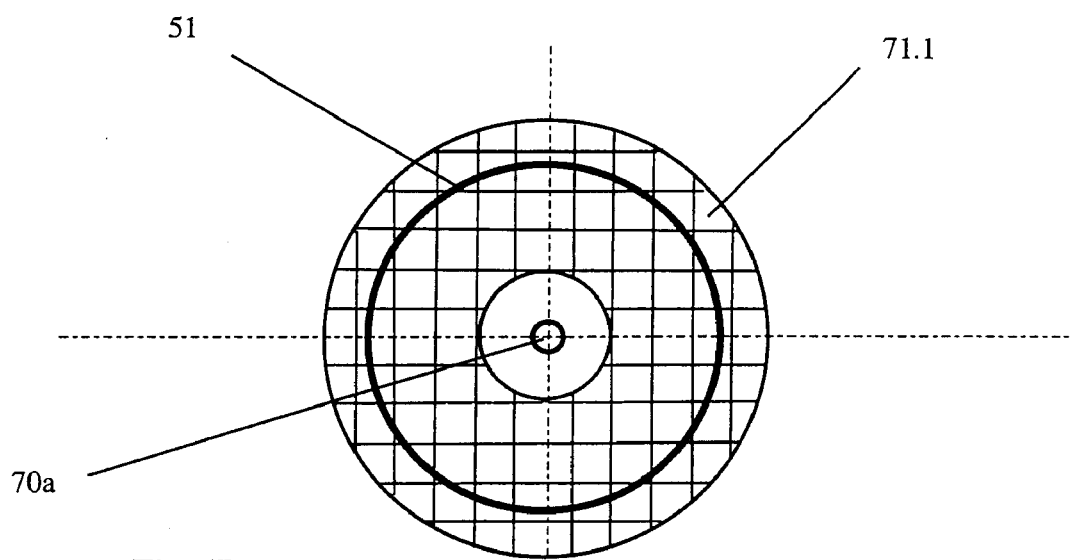
Fig. 4B
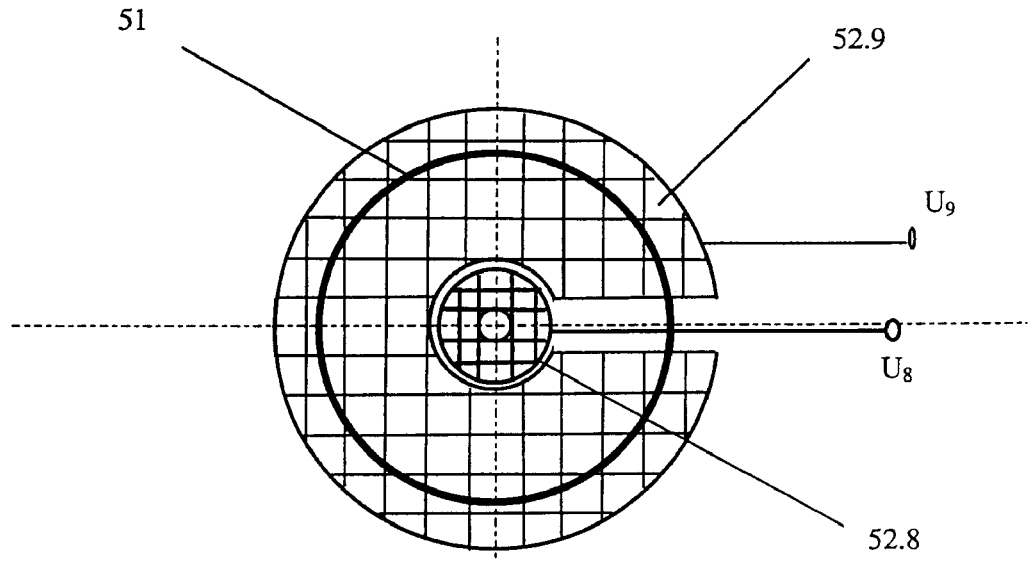
Fig. 5

PARTICLE BEAM APPARATUS

FIELD OF THE INVENTION

This invention relates to a particle beam apparatus for irradiating a particle beam on a specimen and detecting backscattered and secondary particles released at the specimen, and more particularly, to a particle beam apparatus of low voltage application to achieve an improved detection efficiency of backscattered and secondary particles.

FIELD OF THE INVENTION

In a particle beam apparatus, low voltage application is extremely important in the imaging of sensitive and non-conductive specimens. Because of the low energy (typically lower than 5 keV), resulting in low energy dissipation, sensitive specimens are not damaged. Insulating specimens can be imaged without distortion or disturbance, because insulators have a secondary electron yield of about 1 in the low energy range, which avoids or minimizes charging effects during the exposure with the particle beam. Low voltage microscopy, consequently, has a great importance for the dimensional measurement and the inspection of device structures in semiconductor manufacturing processes.

Presently high resolution low voltage microscopes are used for the above mentioned applications. High performance microscopes use a combined electrostatic-magnetic immersion lens as final objective lens. By using the immersion principle, the primary beam path is at high energies. The final low beam energy is generated by deceleration in the objective lens, just in front of the specimen. By applying such intermediate beam acceleration concepts, the electron-electron interaction inside the column, which broadens the beam and consequently decreases the resolution, can be significantly reduced.

The secondary particles released at the specimen by the primary particle beam can be detected by a detector located in front of the objective lens. The arrangement of an in-lens or pre-lens detector has the advantage that the specimen can be located very close to the lens, resulting in a short working distance and correspondingly in a short focal length of the objective lens. A short focal length yields low chromatic and spherical aberration coefficients of the objective lens, which means high optical performance for the low voltage application.

The high performance low voltage arrangements according to the state of the art show a good optical performance, which even can be improved by the application of objective lenses using a combined electrostatic retarding field and magnetic lens. Those arrangements, however, have a drawback in secondary particle detection efficiency. Since the released particles are accelerated by the retarding field of the primary particles, their energy is high and similar to the primary particle energy. Consequently, their behavior is also similar to that of the primary particle beam. Accordingly, the released particle detection is difficult and not very efficient. Therefore, state of the art solutions either use coaxial detectors with small holes for the penetration of the primary beam (EP-B-0 333 018) or means for separation of the primary and the released particle beam (U.S. Pat. No. 5,422,486).

EP-A-1 022 766 proposes a particle beam apparatus, in which, by applying first and second means to decelerate and accelerate the primary particle beam in the region of the detection system, the backscattered and/or secondary particles are decelerated to their original energy distribution by applying a potential in the region of the detector which is close to the potential of the specimen.

Although this known arrangement improves the backscattered and secondary particle detection efficiency, there is still the problem that backscattered particles and secondary particles released at the specimen have different energies. Therefore, it is difficult to detect both kinds of particles in a high efficient manner.

U.S. Pat. No. 5,644,132 discloses a particle beam apparatus for charge-free high resolution imaging and measurement of topographic and material features on a specimen. A particle beam source provides a primary particle beam along a primary beam axis, said primary beam impinging on the specimen so as to release backscattered and secondary electrons. An objective lens is focussing said electrons so as to provide a radial dispersion of said electrons relative to said primary beam axis, said radial dispersion of electrons including an inner annulus of backscattered electrons and an outer annulus of secondary electrons. Furthermore, the apparatus comprises a backscattered electron detector for detecting said inner annulus of backscattered electrons and a secondary electron detector for detecting said outer annulus of secondary electrons. The backscattered electron detector is an electron multiplier.

Furthermore, U.S. Pat. No. 4,308,457 discloses a device for the detection of backscattered electrons emitted by a specimen in an electron microscope, comprising a converter for converting backscattered electrons emitted by the specimen into converted secondary electrons.

SUMMARY OF THE INVENTION

It is an object of the invention to provide a particle beam apparatus with an improved detection efficiency of backscattered and secondary particles released at the specimen.

The particle beam apparatus according to the invention comprises:

- a source for generating a primary particle beam,
- means for focussing the primary particle beam onto a specimen,
- a detection system for detecting particles released at the specimen, e.g. backscattered and/or secondary and/or Auger electrons, said detection system being located between the source and said focussing means, said detection system comprises at least one detector,
- first means to accelerate the primary particle beam to a first energy,
- first means to decelerate the primary particle beam before the detection system from the first energy to a second lower energy,
- second means to accelerate the primary particle beam after the detection system from the second energy to a third higher energy, and
- second means to decelerate the primary particle beam from the third energy to a final beam energy.

The detection system further comprises a converter to convert particles released at the specimen into converted secondary particles which will be detected by the detector.

By providing a deceleration area for the particles released at the specimen in the region of the detection system in combination with a converter for backscattered particles, it is possible to improve the detection efficiency for both, backscattered and secondary, particles.

According to a preferred embodiment, there is a first control electrode and/or a second control electrode, wherein the first and/or second control electrode can be applied with a suitable voltage in order to suppress a part of the particles released at the specimen. With the help of these control electrodes, it is possible to obtain a secondary particle image or a backscattered particle image of the specimen. It is also possible to generate an image, which is based on both kinds of particles.

BRIEF DESCRIPTION OF THE DRAWINGS

Further advantages and embodiments of the invention will be explained in greater detail with reference to the description of some embodiments and the drawings, in which:

FIG. 4A shows a cross-section of the converter according to a first embodiment, FIG. 4B shows a top view of the converter according to FIG. 4A, FIG. 5 shows a top view of a converter according to a second embodiment.

DETAILED DESCRIPTION OF THE INVENTION

Figure 1:
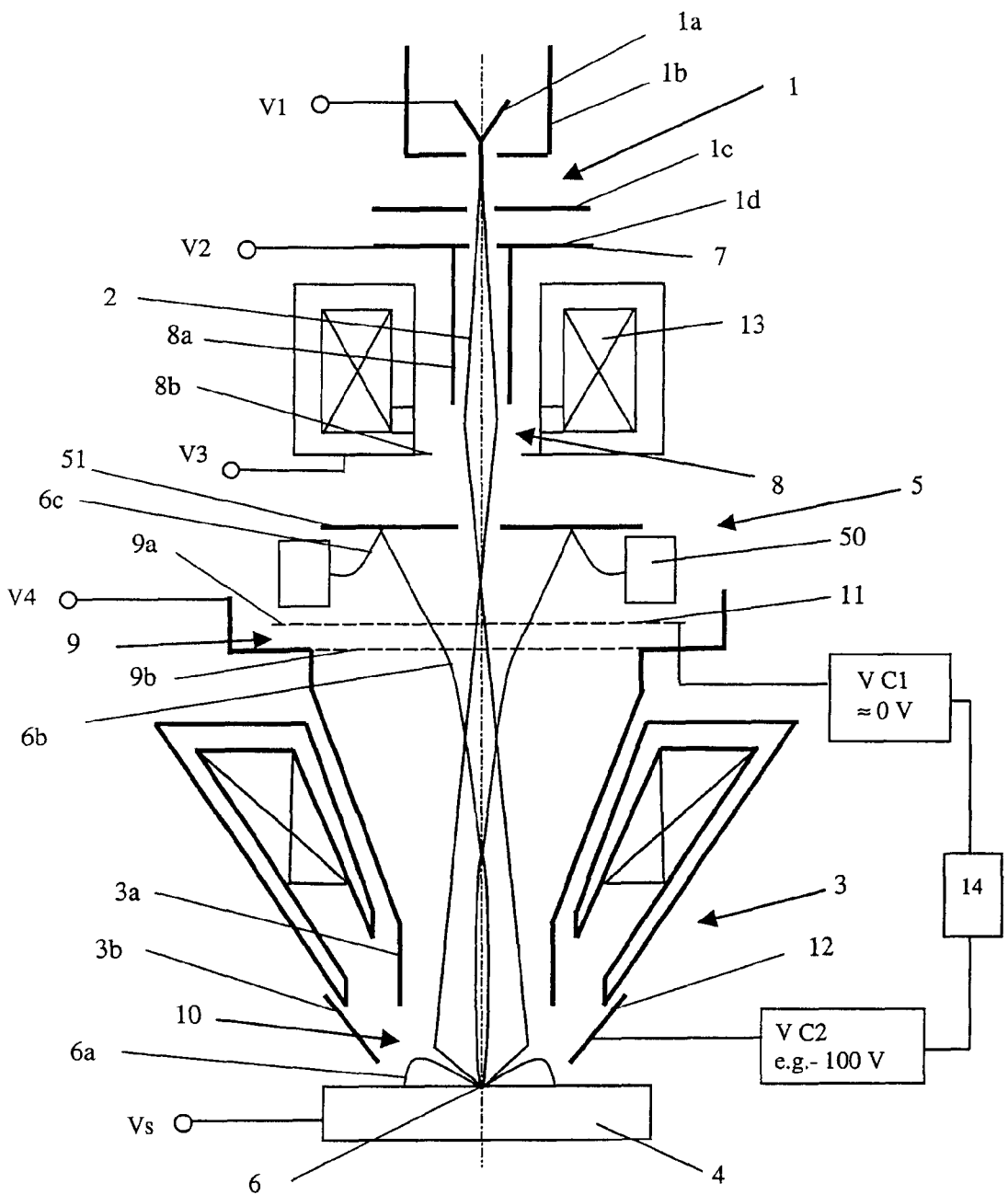
FIG. 1 shows a schematic representation of the particle beam apparatus according to a first embodiment.

A particle beam apparatus according to a first embodiment is disclosed in FIG. 1. Here, the particle beam apparatus essentially comprises:

a source 1 for generating a primary particle beam 2, means 3 for focussing the primary particle beam onto a specimen 4, a detection system 5 for detecting backscattered, secondary and/or other particles released at the specimen, said detecting means being located between the source 1 and the focussing means 3 and comprise at least one detector 50, first means 7 to accelerate the primary particle beam to a first energy $E1(=q*(V2-V1))$, first means 8 to decelerate the primary particle beam before the detection system from the first energy E1 to a second lower energy $E2(=q*(V3-V1))$, second means 9 to accelerate the primary particle beam after the detection system from the second energy E2 to a third higher energy $E3(=q*(V4-V1))$, and second means 10 to decelerate the primary particle beam from the third energy E3 to a final beam energy $EF(=q*(Vs-V1))$, where q is the charge of the primary particle.

The detection system 5 further comprises a converter 51 to convert backscattered particles 6b released at the specimen 4 into converted secondary particles 6c which will be detected by the detector 50.

The particle beam apparatus further comprises a first control electrode 11 arranged shortly before the detector 50 in the direction of the released particles. The first control electrode 11 can be applied with a suitable voltage VC1 in order to suppress a part of the particles released at the specimen.

It is also possible to arrange a second control electrode 12 above the specimen 4 in order to suppress a part of the released particles 6 just above the specimen.

The source 1 comprises, for instance, an electron gun 1a, a suppressor 1b, an extractor 1c and an anode 1d, the gun being preferably a thermal field effect emitter, a cold field emitter or a photo-cathode. The anode 1d also constitutes the first acceleration means 7.

The first deceleration means 8 are constituted by an immersion lens within a condenser lens 13. The immersion lens comprises at least two electrodes 8a, 8b, whereby the first electrode 8a is formed by a liner tube and has a higher potential V2 than the second electrode 8b being at the lower potential V3. The immersion lens generates a retarding field for the primary particle beam 2.

Accordingly, the primary particle beam has a low energy in the region of the detection system 5.

The second acceleration means 9 are arranged shortly after the detection system in the direction of the primary particle beam. The second acceleration means 9 are formed by two grid electrodes 9a, 9b. The first grid electrode 9a also constitutes the first control electrode 11.

The second deceleration means 10 are constituted by an immersion lens within the focussing means 3. The immersion lens comprises at least two electrodes 3a, 3b, whereby the first electrode 3a in the direction of the primary particle beam has a higher potential than the second electrode 3b. The immersion lens generates a retarding field for the primary particle beam. Instead of a magnetic axial gap lens it is also possible to use a single pole or radial gap lens.

The backscattered and/or secondary particles 6 released at the specimen 4, however, will be accelerated by the second deceleration means 10. Consequently, these released particles, after passing the second deceleration means, will have approximately the same high energy as the primary particles, which makes it difficult to detect the released particles. However, the second acceleration means 9 will decelerate the released particles. By applying suitable voltages to the first deceleration means 8 and the second acceleration means 9, it is possible to arrange the detection system 5 in a low energy zone in that the backscattered and/or secondary particles will be decelerated at the detection system to their original energy distribution which is, for instance, for the secondary particles from 0 to 50 eV and for the backscattered particles close to the primary beam energy. Although the primary particles are also decelerated in the detector region, they still have an sufficient energy to pass this area.

The first and second deceleration/acceleration means can be generated by any kind of deceleration and acceleration lenses. The most simple case is a two-electrode lens, which consists of concentric holes or which is formed by grid electrodes. Although combinations of hole electrodes and grid electrodes are efficient. Furthermore, all kinds of elements which have a deceleration and acceleration effect, e.g. Einzellenses, can be used and integrated in the signal detection concept.

The condenser lens 13 generates a crossover in the region of the detection system 5. This has the advantage that the optical effect of the first deceleration means 8 and the second acceleration means 9 on the primary beam performance is marginal and can be disregarded because lenses or optical components in or near a crossover do not have any relevant effects on the beam characteristics.

It is also possible to adapt the particle beam apparatus in that the primary particle beam has not any crossover or has even more than one crossover.

Instead of the second deceleration means constituted by an immersion lens within the focussing means 3 it is also possible to realize the deceleration of the primary particle beam to the final beam energy EF between the focussing means 3 and the specimen. The focussing means 3 has an electrode being at a high potential, e.g. 8 kV and the specimen is at ground potential. However, it will also be possible to perform the deceleration by biasing the specimen to Vs≠0.

The particle 6 released at the specimen consists of secondary particles 6a and backscattered particles 6b.

By providing control means 14 for selectively applying the first and/or second control electrode 11, 12 with suitable voltages, it is possible to drive the particle beam apparatus in different modes.

As the energy of the backscattered particles is higher than the energy of the secondary particles, it is easy to suppress the secondary particles by applying suitable voltages to the first and/or second control electrode 11, 12. Depending on these voltages VC1, VC2, it is possible to obtain a backscattered image of the specimen (first mode). By applying other suitable voltages, it is possible to obtain an image which is based on secondary and backscattered particles (second mode). By suppressing the converted backscattered particles from reaching the detector, it is also possible to obtain a secondary particle image (third mode). The converter will be explained in greater detail below with reference to FIGS. 4 to 7.

Figure 2:
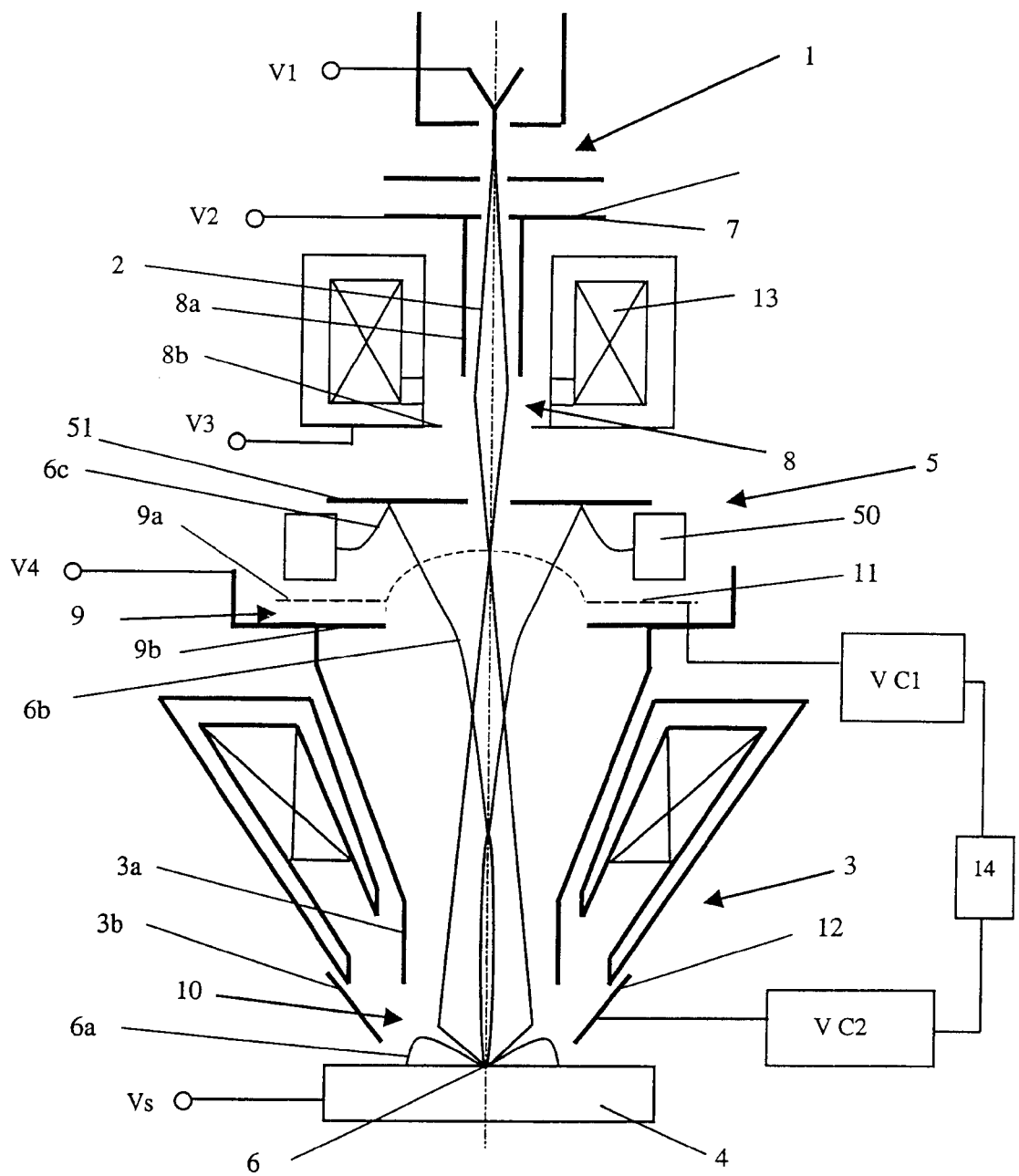
FIG. 2 shows a schematic representation of the particle beam apparatus according to a second embodiment.

FIG. 2 shows a second embodiment of the particle beam apparatus. It differs from the first embodiment by the second acceleration means 9 and the first control electrode 11. The first electrode 9a of the second acceleration means 9 which also forms the first control electrode 11 is constituted by a grid electrode with a curved surface. The second electrode 9b of the acceleration means is formed by a hole electrode. By using the first control electrode with a curved surface, the efficiency of the detection system can be improved.

Figure 3:
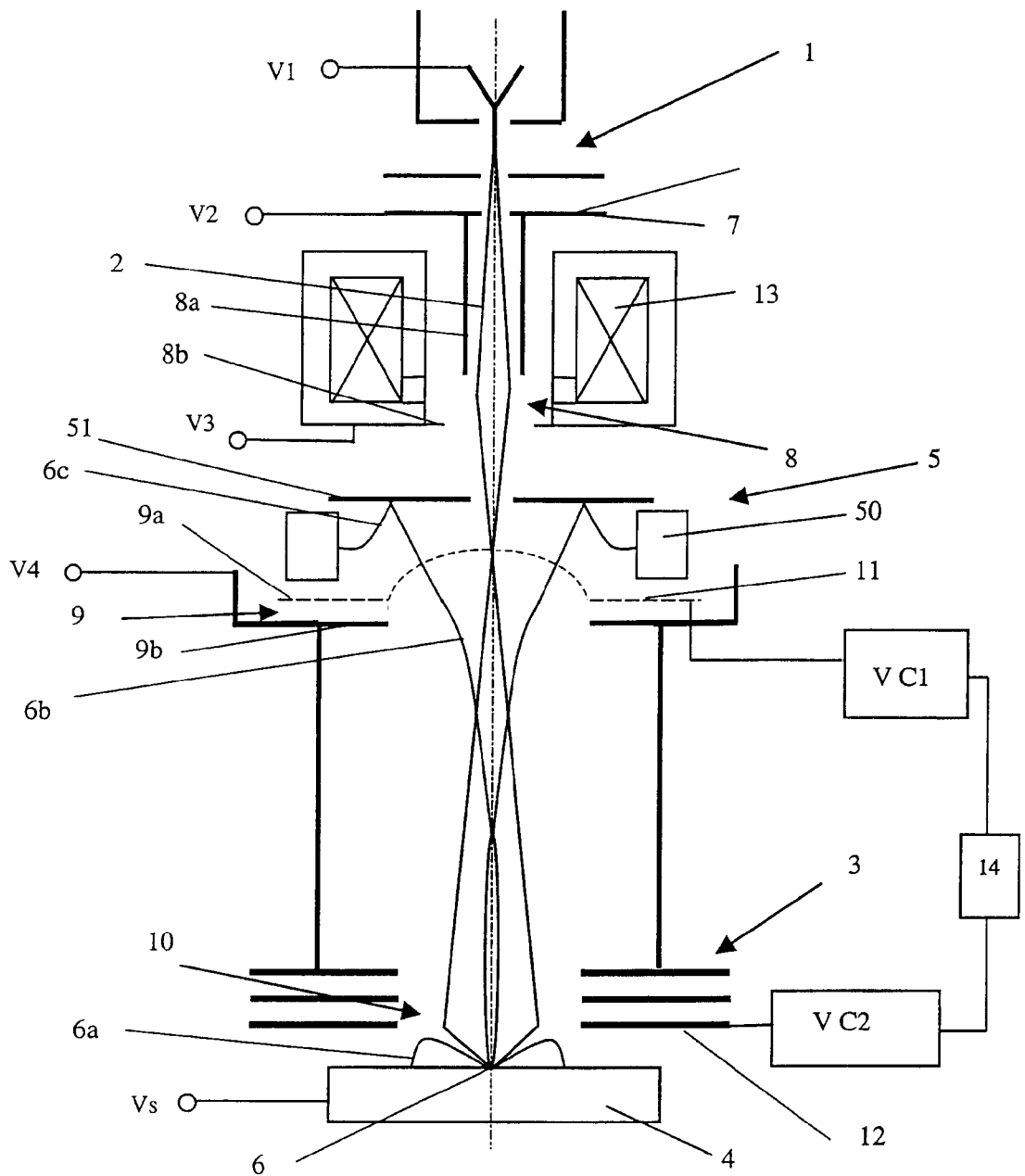
FIG. 3 shows a schematic representation of the particle beam apparatus according to a third embodiment.

The embodiment according to FIG. 3 differs from the second embodiment according to FIG. 2 by the focussing means 3 which is formed by an electrostatic immersion lens.

The detection system comprises a converter 51 with an conversion area to convert the released particles, i.e. backscattered particles 6b, into converted secondary particles 6c which can be detected by the detector 50.

For specific applications, it is possible to combine the converter with converter electrode means for influencing the converted secondary particles.

Different embodiments of converter/converter electrode means will be described below with reference to FIGS. 4a to 7.

The converter 51 and the converter electrode means 52 are adapted to control the converted secondary particles 6c in that a suitable voltage between the converter 51 and the converter electrode means 52 prevents converted secondary particles released at a specific part or parts of the conversion area from reaching the detector 50.

FIGS. 4A and 4B show a converter 51 which is formed by a converter plate having a central hole 51a for the primary particle beam. The converter electrode 52.1 is formed of an annular electrode which can be applied with a variable voltage $U_1$. The converter may be supplied with a variable Voltage $U_0$. The converter electrode 52.1 is formed by a grid electrode which allows penetration of the released particles to reach the converter 51.

The converter 51 is arranged perpendicular to the primary beam axis and has at least one opening 51a for the primary particle beam which can be used as a system aperture for the primary particle beam. The converter electrode 52.1 can extend in a plane which is perpendicular to the primary beam axis, wherein the converter electrode covers at least a part of the converter 51 in the direction of the particles 6 released at the specimen. The conversion area of the converter according to FIG. 4b comprises at first annular part which is covered by the converter electrode 52.1 and a second part, a circle around the aperture 51a, which is not covered by the converter electrode.

By applying a suitable voltage between the converter and the converter electrode, it will be possible to prevent those converted secondary particles released at the outer annular part of the conversion area (which is covered by the converter electrode 52.1) from reaching the detector 50. In order to suppress these converted secondary particles, the converter electrode may be applied with a negative voltage $U_1$, while the voltage $U_0$ is zero. If the voltage $U_1$ is positive, all converted secondary particles will be gathered by the positive grid electrode. After penetrating the converter electrode, the secondary particles 6c are detected by detector 50 which can be a conventional secondary electron detector (e.g. a scintillator/photomultiplier arrangement). By applying a positive or negative voltage to the converter electrode, the contribution of this special part of the converter 51 which is covered by the converter electrode can be controlled. A zero voltage or a positive voltage to the converter electrode ensures that all converted secondary particles 6c starting from the converter 51 can reach the detector 50 and contribute to the signal. A negative voltage (typically −2 V to −50 V) suppresses the converted secondary particles and consequently parts of the converter covered by the converter electrode cannot contribute to the detected signal.

In the case that normal surface imaging is performed, the converter electrode 52.1 is at zero or slightly positive, which means that all converted secondary particles can be detected by the detector 50. In the case that the inner part of a contact hole shall be imaged, a negative voltage $U_1$ will be applied to the converter electrode. Accordingly, only those converted secondary particles will contribute to the detected signals which are converted at the inner part of the converter 51 which is not covered by the converter electrode.

The second embodiment according to FIG. 5 shows converter electrode means having two converter electrodes 52.2, 52.3 which can be applied with variable voltages $U_2$, $U_3$. The inner converter electrode 52.3 has a circular shape wherein the electrode 52.2 is annular. Both electrodes are arranged concentrically in a plane perpendicular to the primary beam axis.

The advantage of this embodiment is the possibility to prevent those converted secondary particles released at the inner circular part which is covered by electrode 52.3 from reaching the detector. Accordingly, only those converted secondary particles released at the outer annular part of the conversion area will reach detector 50. Of course, it will also be possible to suppress those converted secondary particles of the outer annular part of the converter in order to detect the secondary particle released at the inner circular part.

Figure 6:
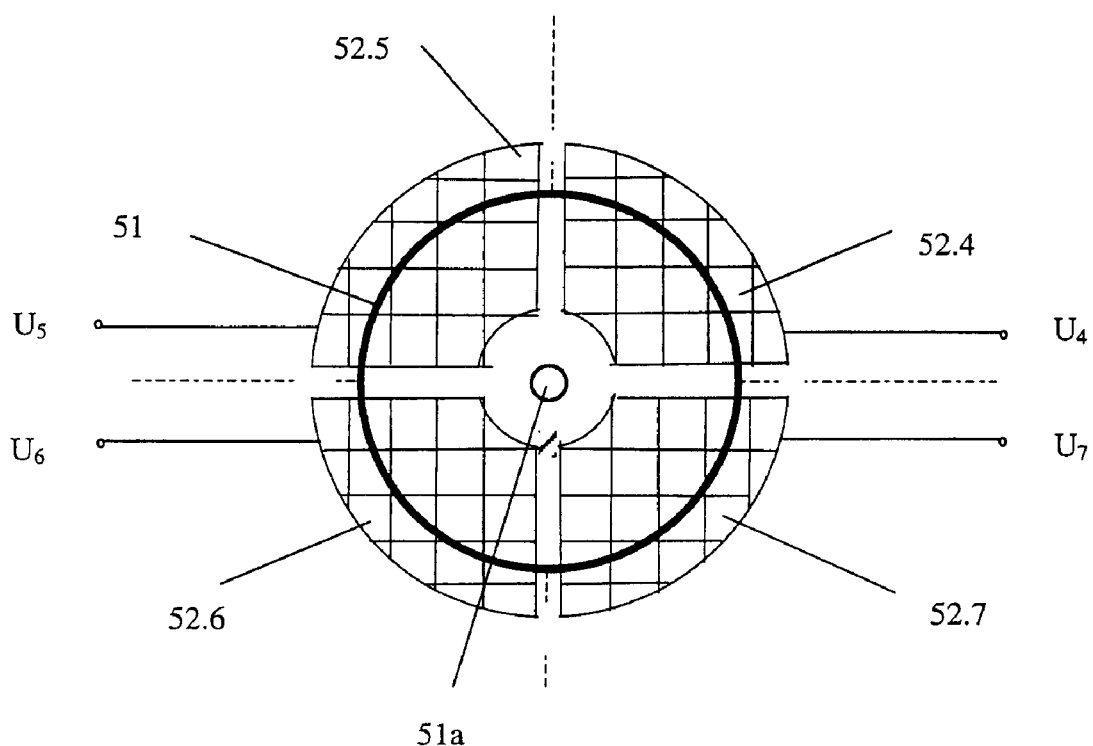
FIG. 6 shows a top view of a converter according to a third embodiment.

FIG. 6 discloses an embodiment with four angular segmented electrodes 52.4, 52.5, 52.6 and 52.7, which can be applied with variable voltages $U_4$, $U_5$, $U_6$, $U_7$. All angular segments cover the whole conversion area of the converter except a circular part around the hole 51a. With such an arrangement it is possible to get information from converted particles of the inner circle in addition to information of one or more segments.

Depending on the imaging/measuring tasks other arrangements of electrodes are possible, e.g. more than one annular electrode or more or less than four annular segmented electrodes or a combination of both arrangements.

Figure 7:
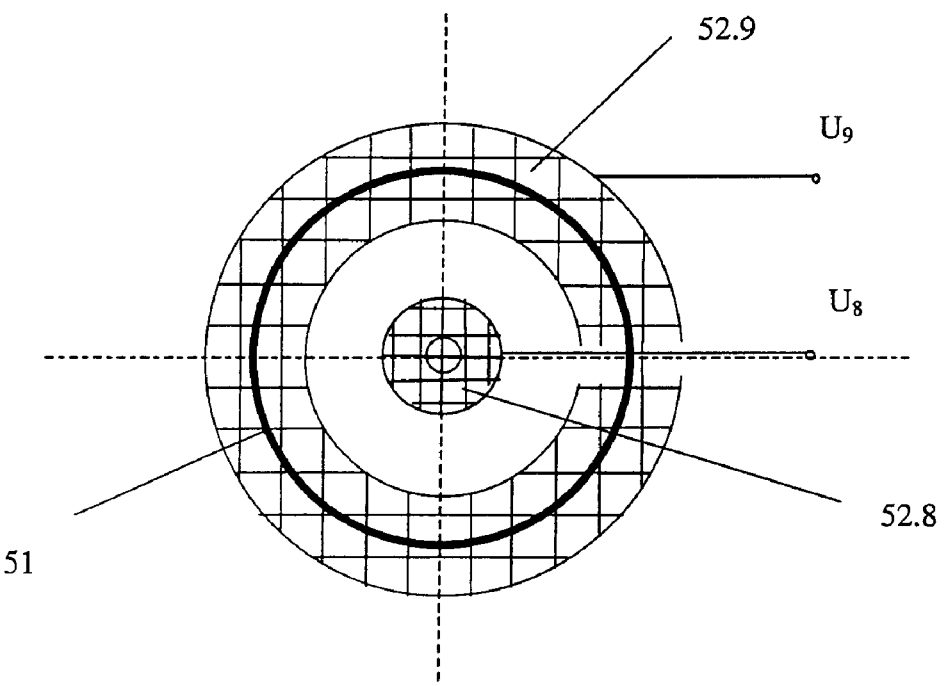
FIG. 7 shows a top view of a converter according to a fourth embodiment.

FIG. 7 discloses an embodiment for the detection of a special angular distribution. It has two converter electrodes 52.8, 52.9 which can be applied with variable voltages $U_8$, $U_9$. The inner electrode 52.8 has a circular shape wherein the converter electrode 52.9 is annular. Both electrodes are arranged concentrically in a plane perpendicular to the primary beam axis. There is an annular gap between the two converter electrodes. Accordingly, the converter is divided into three parts. The inner circle is covered by the converter electrode 52.8. A first annular part which is not covered by the converter electrodes and an outer annular part which is covered by electrode 52.9.

Although all embodiments shown in FIGS. 4 to 7 comprise one or more converter electrodes, it is not essential to have such a converter electrode. If the information of the place on the specimen, where the backscattered particles have been released, is not important, the converter electrodes can be omitted.

FIGS. 8 to 12 show further embodiments of the primary particle beam according to the invention. The embodiment according to FIG. 8 corresponds to FIG. 1. The voltage or voltages of the first and/or second control electrode 11, 12, is adapted in that secondary particles released at the specimen and backscattered particles will be detected simultaneously.

Furthermore, the first deceleration means 8 are not realized within the condenser but just above the detection system 5. The first deceleration means 8 comprise a first grid electrode 8c at the end of a liner tube and a second grid electrode 8d just above the converter 51.

Figure 8:
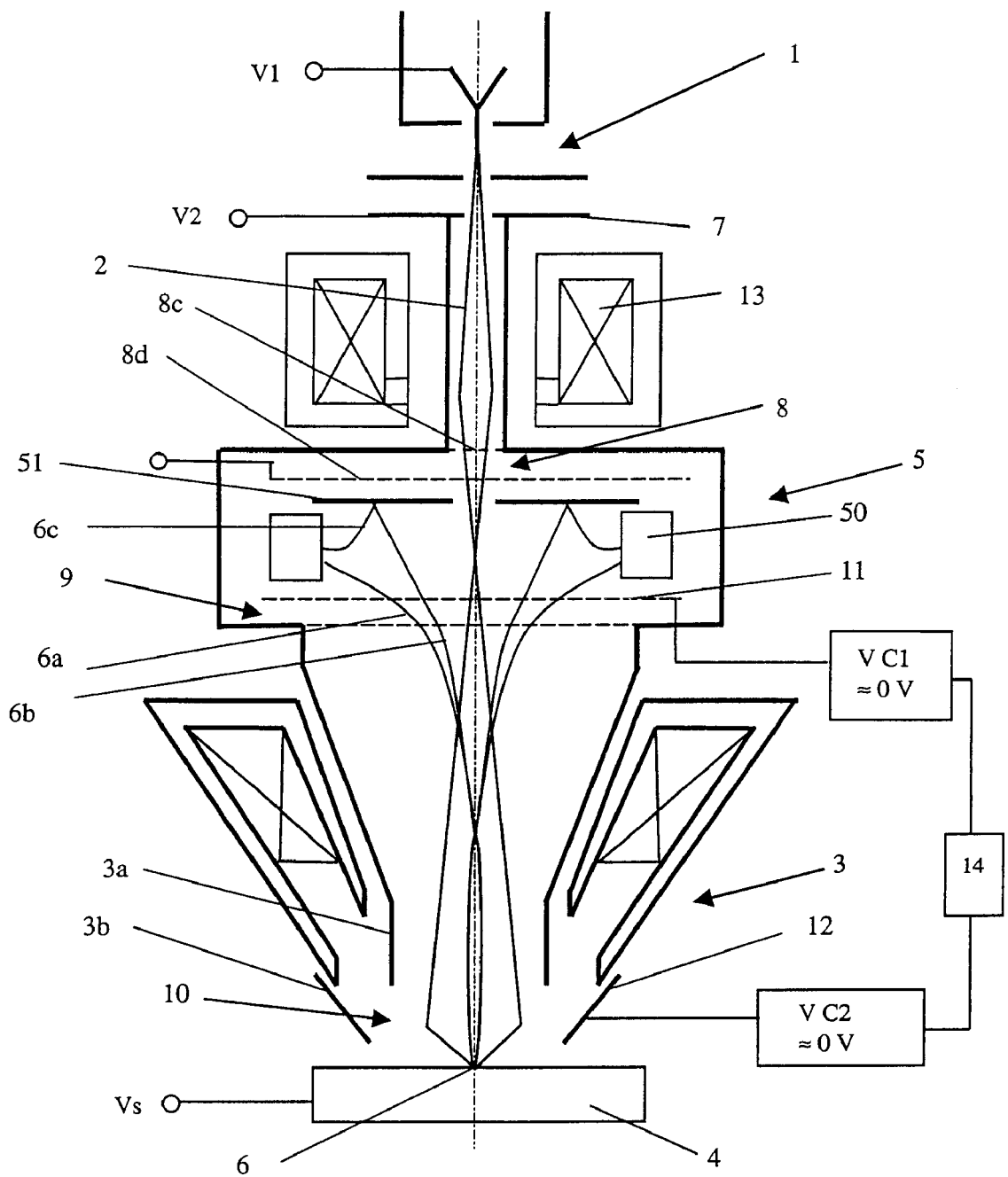
FIG. 8 shows a schematic representation of the particle beam apparatus according to a fourth embodiment.
Figure 9:
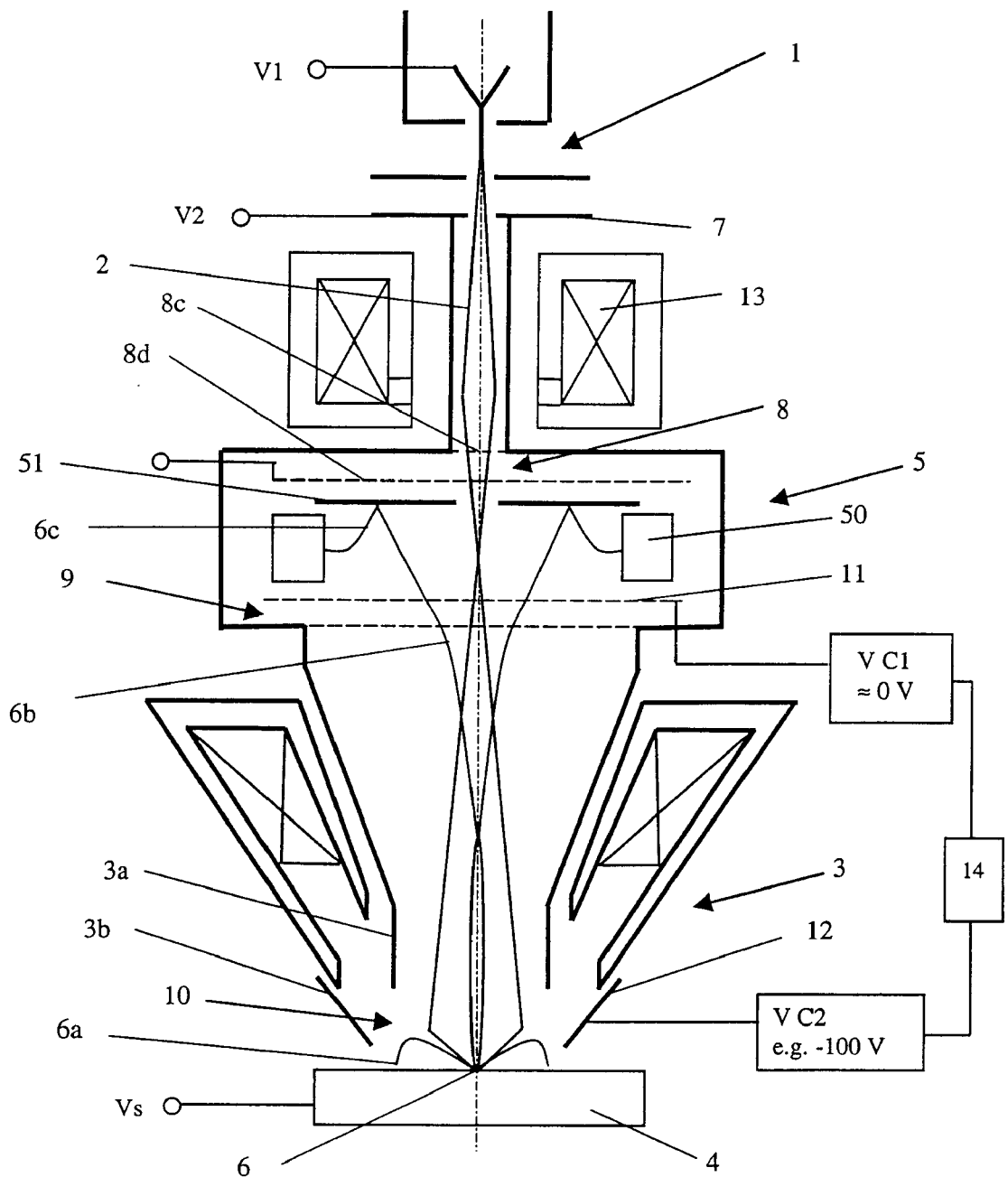
FIG. 9 shows a schematic representation of the particle beam apparatus according to a fifth embodiment.

FIG. 9 discloses the same embodiment as shown in FIG. 8. However, the apparatus is operating in another mode in which the secondary particles 6a released at the specimen 4 are suppressed by the second control electrode 12. In the mode shown in the embodiment according to FIG. 10, the secondary particles 6a released at the specimen are suppressed at the first control electrode 11.

Figure 10:
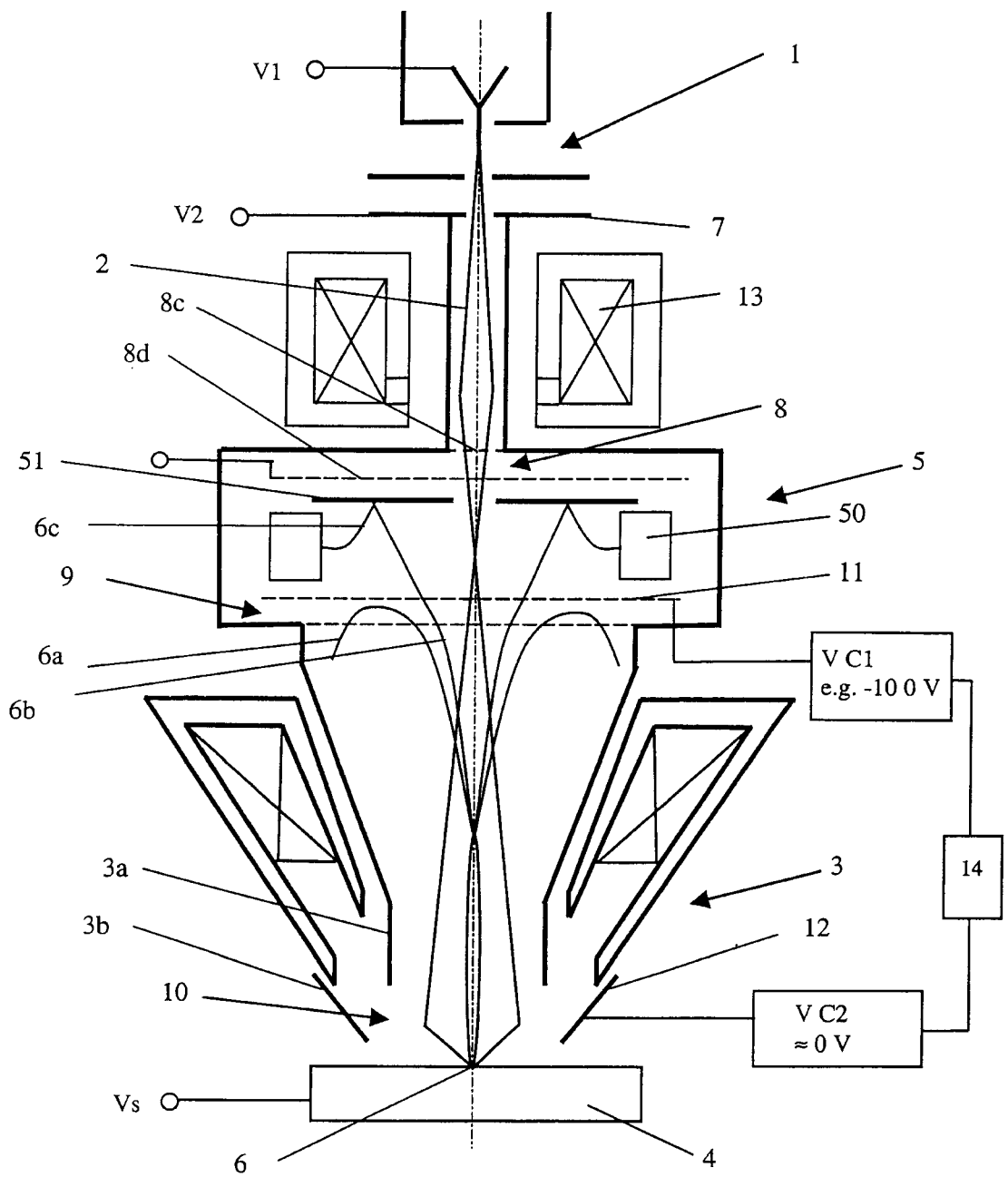
FIG. 10 shows a schematic representation of the particle beam apparatus according to a sixth embodiment.
Figure 11:
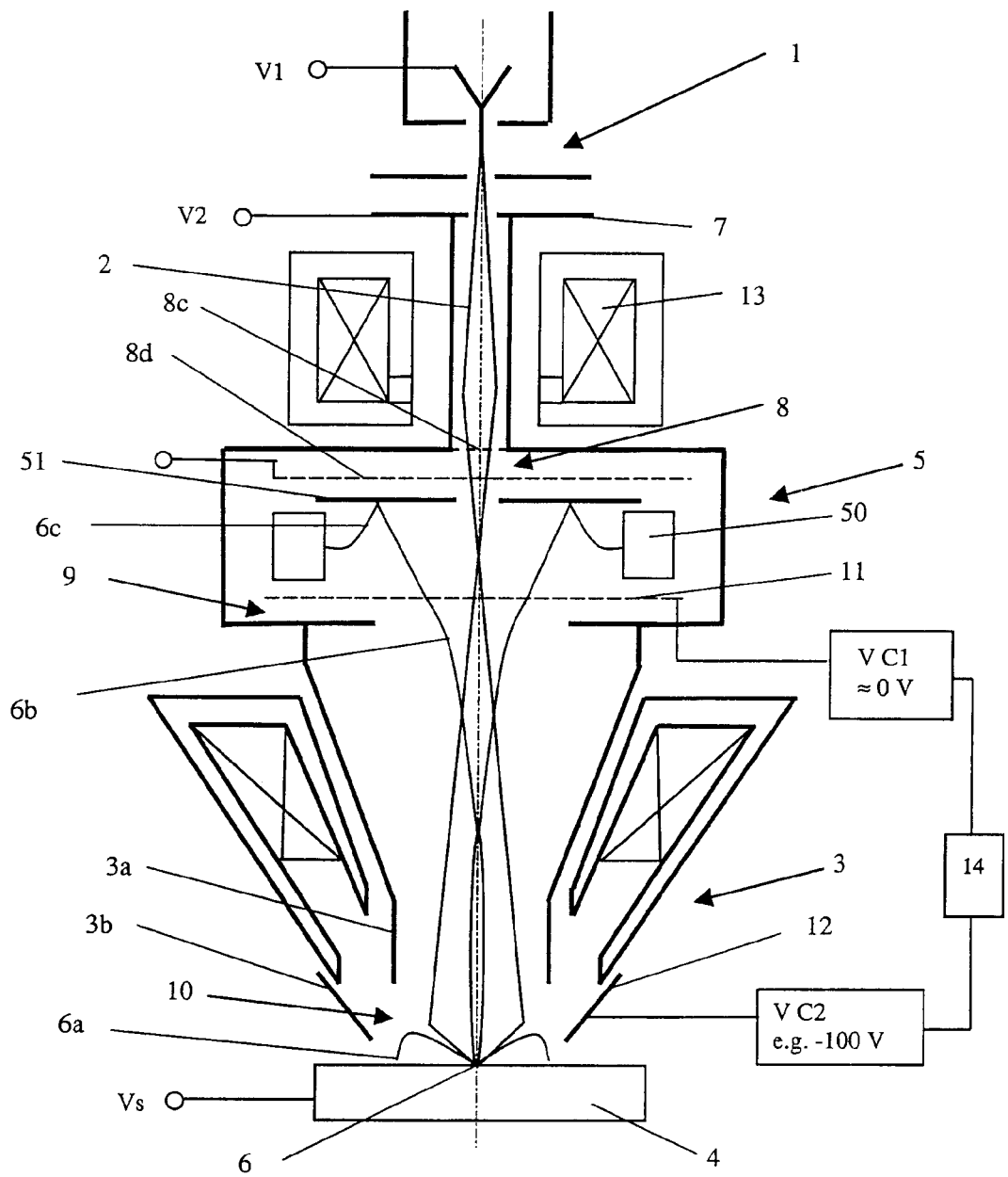
FIG. 11 shows a schematic representation of the particle beam apparatus according to a seventh embodiment.

The apparatus according to FIG. 11 differs from the apparatus shown in FIGS. 9 and 10 by the second acceleration means 10 whose second electrode 10b is a hole electrode.

Figure 12:
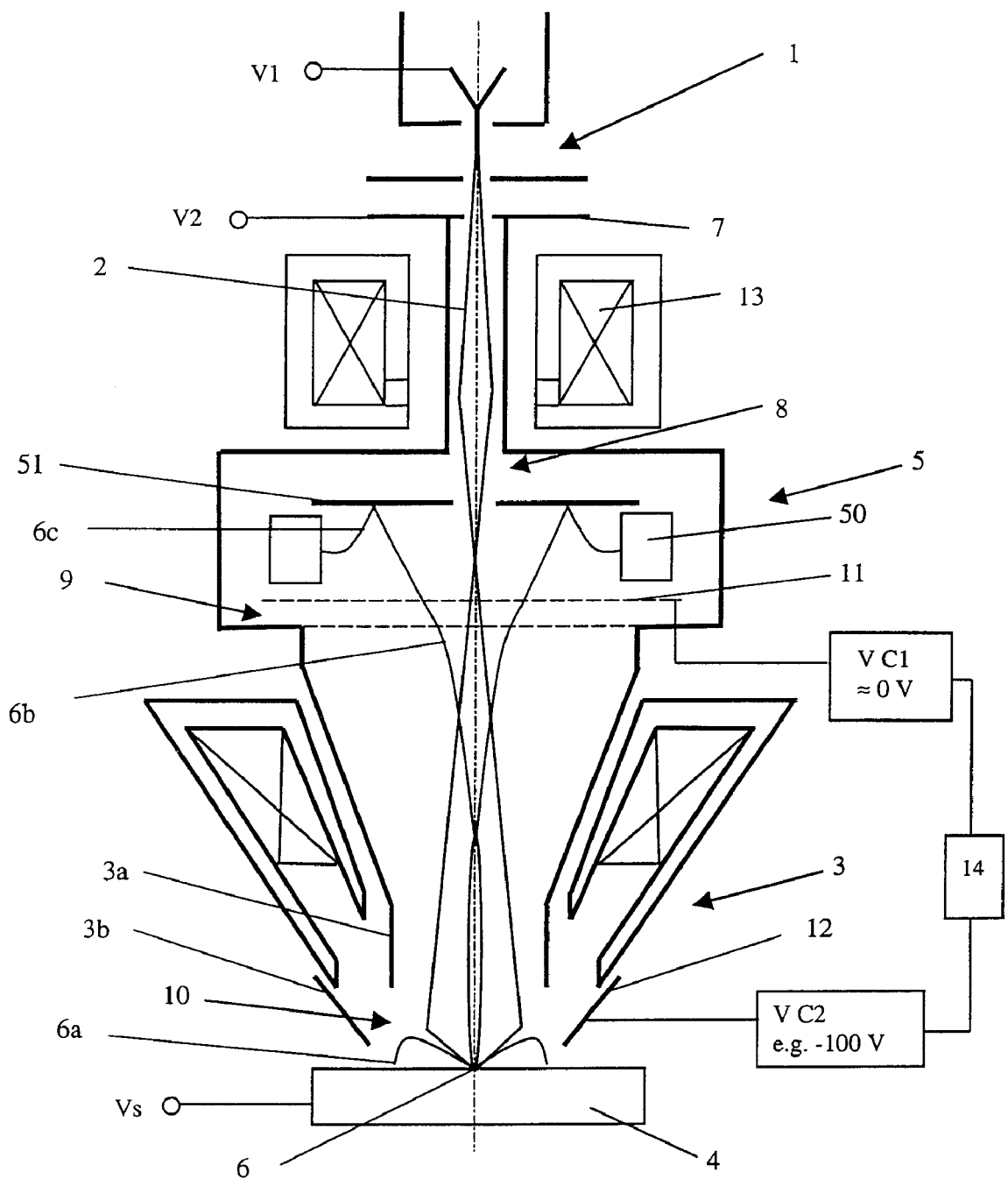
FIG. 12 shows a schematic representation of the particle beam apparatus according to a eighth embodiment.

The first deceleration means 9 of the embodiment according to FIG. 12 are realized by the end of the liner tube and the converter 51.

All embodiments show that there are numerous possibilities to realize the apparatus according to the invention. It is also possible to combine features of different embodiments to form a particle beam apparatus which is not specifically disclosed in the drawings.

What is claimed is:

1. A particle beam apparatus, comprising:
 a source (1) for generating a primary particle beam (2);
 means (3) for focussing the primary particle beam onto a specimen (4);
 a detection system (5) for detecting particles (6a, 6b) released at the specimen, said detection system being located between the source (1) and said focussing means (3) and comprises at least one detector (50);
 first means (7) to accelerate the primary particle beam to a first energy E1;
 first means (8) to decelerate the primary particle beam before the detection system from the first energy E1 to a second lower energy E2;
 second means (9) to accelerate the primary particle beam after the detection system from the second energy E2 to a third higher energy E3; and
 second means (10) to decelerate the primary particle beam from the third energy E3 to a final beam energy EF;
 wherein the detection system further comprises a converter (51) to convert particles into converted secondary particles (6b) which will be detected by the detector (50).

2. A particle beam apparatus according to claim 1, wherein a first control electrode (11) and/or a second control electrode (12), the first and/or second control electrode can be applied with a suitable voltage (VC1, VC2) in order to suppress a part of the particles (6) released at the specimen.

3. A particle beam apparatus according to claim 2, further comprising control means (14) for selectively applying the first and/or second control electrode (11, 12) with at least a first voltage in order to suppress secondary particles released at the specimen and a second voltage which does not suppress any particles from reaching the detector (50).

4. A particle beam apparatus according to claim 3, wherein the control means (14) is adapted to apply the first and/or second control electrode (11, 12) with a third voltage in order to suppress only a part of the secondary particles released at the specimen (4).

5. A particle beam apparatus according to claim 2, wherein said first control electrode (11) is a grid electrode.

6. A particle beam apparatus according to claim 2, wherein said first control electrode (11) is a grid electrode with a curved surface.

7. A particle beam apparatus according to claim 2, wherein the first control electrode (11) is an aperture electrode.

8. A particle beam apparatus according to claim 1, wherein the first control electrode is arranged between the first deceleration means (8) and the second acceleration means (9).

9. A particle beam apparatus according to claim 1, wherein the second control electrode (12) is arranged between the second deceleration means (10) and the specimen (4).

10. A particle beam apparatus according to claim 1, wherein the second control electrode (12) is a part of the second deceleration means (10).

11. A particle beam apparatus according to claim 1, wherein said first deceleration means (8) is formed by a condenser lens.

12. A particle beam apparatus according to claim 1, wherein said first deceleration means (8) is formed by electrodes.

13. A particle beam apparatus according to claim 1, wherein said second deceleration means (10) is formed by a magnetic and/or electrostatic immersion lens.

14. A particle beam apparatus according to claim 1, wherein the specimen (4) is a part of the second deceleration means (10).

15. A particle beam apparatus according to claim 1, wherein the first and second acceleration means (7, 9) are adapted in that the first energy (E1) of the first acceleration means is equal to the third energy (E3) of the second acceleration means.

16. A particle beam apparatus according to claim 1, wherein the first and second acceleration means (7, 9) are adapted in that the first energy (E1) of the first acceleration means differs from the third energy (E3) of the second acceleration means.

17. A particle beam apparatus according to claim 1, wherein the particle beam apparatus is adapted in that the primary particle beam (2) has a crossover being arranged in the region of the detection system (5).

18. A particle beam apparatus according to claim 1, wherein said first and/or second acceleration means (7, 9) are formed by electrodes.

19. A particle beam apparatus according to claim 1, wherein said converter (51) is formed by a converter plate having at least one opening (51*a*) for the primary particle beam.

20. A particle beam apparatus according to claim 1, wherein said converter (51) is formed by a converter plate having at least one opening (51*a*) that is used as a system aperture for the primary particle beam (2).

21. A particle beam apparatus according to claim 1, wherein the detection system (5) further comprises converter electrode means (52) for influencing the converted particles, the converter having a conversion area and the control electrode means is adapted to control the converted particles in that a suitable voltage between the converter and the converter electrode means prevents converted particles released at a specific part or parts of the conversion area from reaching the detector (50).

22. A particle beam apparatus according to claim 21, wherein the converter (51) is formed by a converter plate arranged perpendicular to the primary beam axis and has at least one opening (51*a*) for the primary particle beam (2) and in that the control electrode means extends in a plane which is perpendicular to the primary beam axis, wherein the control electrode means covers at least a part of the converter plate in the direction of the released particles.

23. A particle beam apparatus according to claim 21, wherein the converter electrode means is formed of at least one annular electrode (52.2; 52.9).

24. A particle beam apparatus according to claim 21, wherein the converter electrode means is formed by several angular segmented electrodes (52.4, 52.5, 52.6, 52.7).

* * * * *